(12) United States Patent
Lee

(10) Patent No.: US 9,819,346 B2
(45) Date of Patent: Nov. 14, 2017

(54) PLC SYSTEM

(71) Applicant: LSIS CO., LTD., Gyeonggi-do (KR)

(72) Inventor: Ho-Kee Lee, Gyeonggi-do (KR)

(73) Assignee: LSIS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/293,210

(22) Filed: Oct. 13, 2016

(65) Prior Publication Data

US 2017/0111048 A1    Apr. 20, 2017

(30) Foreign Application Priority Data

Oct. 20, 2015    (KR) ........................ 10-2015-0146346

(51) Int. Cl.

| H03K 19/177 | (2006.01) |
|---|---|
| H01L 25/00 | (2006.01) |
| G06F 1/18 | (2006.01) |
| G05B 19/05 | (2006.01) |
| G11C 5/14 | (2006.01) |

(52) U.S. Cl.
CPC ....... *H03K 19/1776* (2013.01); *G05B 19/058* (2013.01); *G06F 1/189* (2013.01); *G11C 5/14* (2013.01); *G05B 2219/14053* (2013.01); *G05B 2219/24137* (2013.01)

(58) Field of Classification Search
None
See application file for complete search history.

(56) References Cited

U.S. PATENT DOCUMENTS

| 8,767,354 B1 | 7/2014 | Ferris et al. |
|---|---|---|
| 2007/0176491 A1 | 8/2007 | Kang et al. |

(Continued)

FOREIGN PATENT DOCUMENTS

| JP | 2014123187 A | 7/2014 |
|---|---|---|
| JP | 2014160377 A | 9/2014 |

(Continued)

OTHER PUBLICATIONS

Korean Office Action dated Nov. 28, 2016 for corresponding KR application 10-2015-0146346.

(Continued)

*Primary Examiner* — Anh Tran
(74) *Attorney, Agent, or Firm* — Nath, Goldberg & Meyer; Jerald L. Meyer; Stanley N. Protigal

(57) ABSTRACT

In some embodiments, a PLC system includes a memory unit configured to back up user data stored in a MCU thereto when the power supply from the power module is interrupted, a capacitor configured to be charged by the power module and supply accumulated power to the memory unit when the power from the power module to the MCU is interrupted, a variable resistor unit configured to be coupled between the power module and the capacitor, and a switching unit configured to alternatively couple either the power module or the capacitor to the memory unit depending on a state of power being supplied from the power module. Some embodiments may provide advantages that a PLC system can supply much more power while reducing a charging period of time of an auxiliary power supply for supplying power with urgency when an abnormality occurs in a power module of the PLC system.

4 Claims, 2 Drawing Sheets

(56) References Cited

U.S. PATENT DOCUMENTS

| | | |
|---|---|---|
| 2009/0125156 A1 | 5/2009 | Killian et al. |
| 2009/0289607 A1 | 11/2009 | Mentelos |
| 2010/0146333 A1* | 6/2010 | Yong .................. G06F 1/305 |
| | | 714/14 |
| 2012/0280564 A1 | 11/2012 | Brookfield |

FOREIGN PATENT DOCUMENTS

| | | |
|---|---|---|
| KR | 100706436 B1 | 4/2007 |
| KR | 20100120482 A | 11/2010 |
| KR | 1020100116940 A | 11/2010 |
| WO | 2011/099117 A1 | 8/2011 |

OTHER PUBLICATIONS

European Search Report dated Feb. 20, 2017 issued in corresponding European Application No. 16181218.5.

* cited by examiner

PLC SYSTEM

CROSS REFERENCE TO RELATED APPLICATIONS

This application claims the benefit of Korean Patent Application No. 10-2015-0146346, filed on Oct. 20, 2015, entitled "PLC SYSTEM", which is hereby incorporated by reference in its entirety.

BACKGROUND

Technical Field

The present disclosure relates to a programmable logic controller (PLC) system, and, more particularly, a PLC system configured to perform backup of user data through an auxiliary power supply when power supply from a power module is interrupted.

Description of the Related Art

Previously, factory systems have been operated by individually controlling machines or apparatuses. However, modern industry becomes increasingly complicated and diversified, and thus such systems need to be changed accordingly. To support complicated systems and safely operate major facilities, additional apparatuses are required. As one of such apparatuses, a PLC system has been developed to directly control lines at industrial sites.

The PLC is an electronic device configured to use a programmable memory and control various types of machines or processors in order to perform special functions such as logic, sequencing, timing, counting, calculation, etc., through a digital or analog input/output module.

The PLC is usually the most fundamental controller along with the industry automation and is a system commonly utilized for the facility automation in a factory, a building or the like. At its early stage, the PLC system performed simple and basic calculations. Nowadays, the PLC system not only performs complicated application calculations but also forms an industrial network, thereby meeting various demands at the fields.

As shown in FIG. 1, a conventional PLC system 10 includes a single base 102, a power module 104, a Central Processing Unit (CPU) module 106, a communications module 108, an I/O module 110, and other modules 112. The base 102 may generally mount thereon the single power module 104 and the CPU module 106. Further, the base 102 may mount thereon the communications module 108, the I/O module 110 and the other modules 112 within a range of space where the base can allow them to be mounted. In addition, the single base 102 may mount thereon the single power module 104, meaning that the number of modules mounted on the bases 102 is limited depending on the power which can be supplied from the power module 104.

FIG. 2 illustrates a configuration of a CPU module included in the conventional PLC system.

The CPU module 106 included in the conventional PLC system is supplied with the power from the power module for the operation. A MCU (Micro Controller Unit) 208 included in the CPU module 106 performs control functions on another module as well as various calculation functions, and performs functions of managing user data. Such functions may be performed by the power supplied from the power module 104, whereby the supply of power from the power module 104 may be interrupted if abnormality occurs in the power module 104.

When the supply of power from the power module 104 is interrupted, the MCU 208 controls a switching unit 204 to substitute an auxiliary power supply 202 as a power supply source. Accordingly, the MCU 208 and a SRAM 206 are supplied with the power accumulated on the auxiliary power supply 202. The MCU 208 performs an operation of backing up the user data stored in the MCU 208 into the SRAM 206.

By the way, according to the conventional technology as shown in FIG. 2, a secondary battery such as a lithium-ion battery is usually employed as the auxiliary power supply 202. However, such a secondary battery has any problems that its charging period of time is long and its lifetime is short.

Further, while in the conventional technology as shown in FIG. 2, a low-speed memory such as a Static Random-Access Memory (SRAM) is used, a higher power is required for the operation of the memory when a high-speed memory such as a flash memory is used. However, the secondary battery such as the lithium-ion battery has any problem that it is difficult to provide the high-speed memory with a sufficient power for the operation due to the limitation of capacity.

In addition, the secondary battery may be likely to explode in the course of repeating a charging and a discharging thereof

SUMMARY

It is an aspect of some embodiments of the present disclosure to provide a PLC system capable of supplying much more power while reducing a charging period of time of an auxiliary power supply for supplying power with urgency when an abnormality occurs in a power module of the PLC system.

It is another aspect of some embodiments of the present disclosure to provide a PLC system including an auxiliary power supply capable of reducing a possibility of accident which may be caused due to an explosion, while including a longer lifetime.

It is still another aspect of some embodiments of the present disclosure to provide a PLC system capable of more quickly and safely backing up data when the backup of the data should be performed due to the abnormality occurrence in a power module of the PLC system.

Other objects of some embodiments of the present disclosure are not limited to the above-described object and other objects and advantages can be appreciated by the following description described with reference to some embodiments of the present disclosure. Further, it will be easily appreciated that the objects and advantages of some embodiments of the present disclosure can be realized by means and a combination thereof recited in the appended claims.

In accordance with one aspect of some embodiments of the present disclosure, a PLC system operated by receiving power from a power module includes a memory unit configured to back up user data stored in a MCU thereto when the power supply from the power module is interrupted, a capacitor configured to be charged by the power module and supply accumulated power to the memory unit when the power from the power module to the MCU is interrupted, a variable resistor unit connected between the power module and the capacitor, and a switching unit configured to alternatively connect either the power module or the capacitor to the memory unit depending on a state of power being supplied from the power module.

According to some embodiments of the present disclosure, a resistance of the variable resistor unit may be flexibly determined depending on a capacity of the power module.

Further, according to some embodiments of the present disclosure, another operation of the PLC system other than the charging of the capacitor may be restricted until the charging of the capacitor is completed.

Further, the PLC system according to some embodiments of the present disclosure may further include a voltage transform unit configured to be coupled between the capacitor and the switching unit and transform a voltage of the power supplied from the capacitor to that corresponding to a voltage needed for the memory unit.

In addition, according to some embodiments of the present disclosure, the switching unit may couple the power module and the memory unit only when the backup is finished, even in a state where the supply of power from the power module is resumed by allowing the switching unit to couple the capacitor to the memory unit.

According to some embodiments of the present disclosure as described above, there is an advantage that it can supply much more power while reducing a charging period of time of an auxiliary power supply for supplying power with urgency when an abnormality occurs in a power module of the PLC system. According to some embodiments of the present disclosure, there is another advantage that an auxiliary power supply of the PLC system according to some embodiments of the present disclosure may reduce the possibility of accident which may be caused due to the explosion, while including a longer lifetime.

According to some embodiments of the present disclosure, there is still another advantage that it can more quickly and safely back up data when the backup of data should be performed due to the abnormality occurrence in a power module of the PLC system.

DETAILED DESCRIPTION

Figure 1:
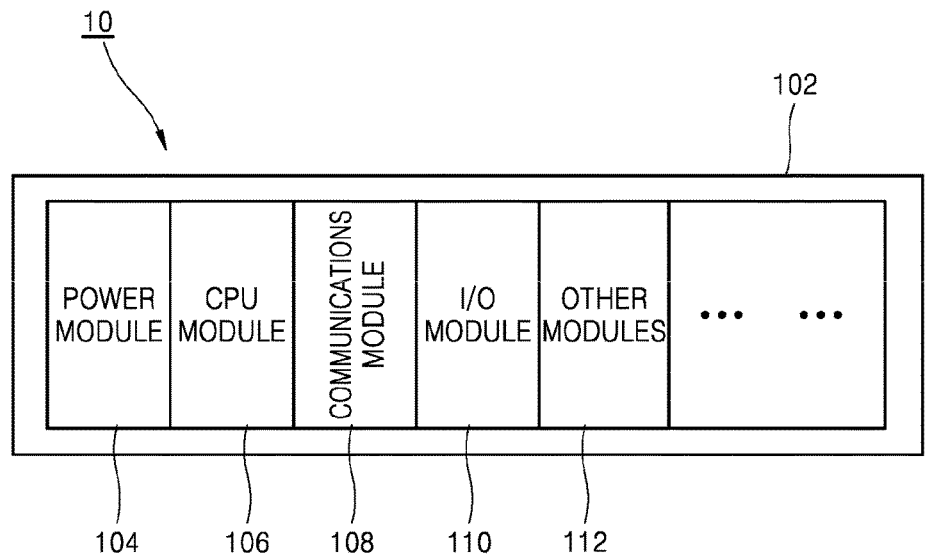
FIG. 1 illustrates a configuration of a conventional PLC system, according to the prior art.
Figure 2:
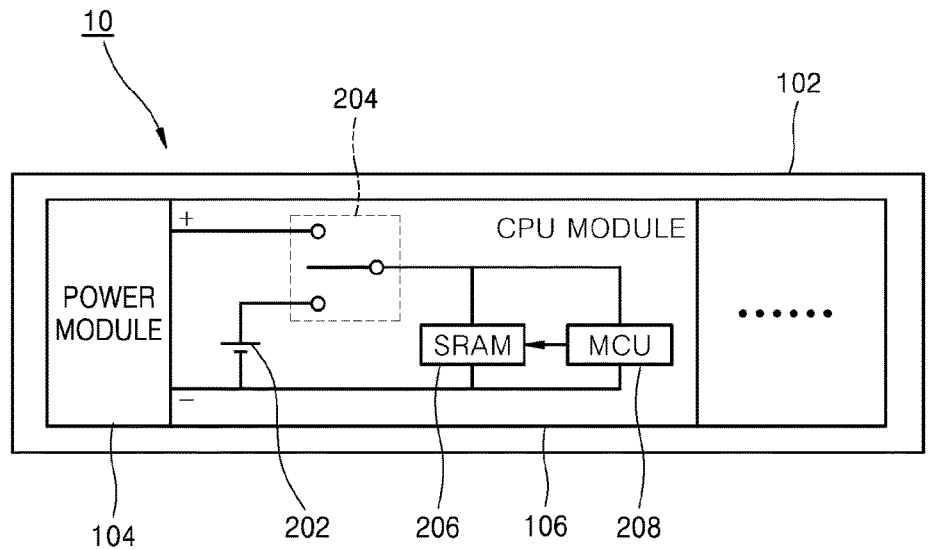
FIG. 2 illustrates a configuration of a CPU module included in the conventional PLC system, according to the prior art.

The above objects, features and advantages will become apparent from the detailed description with reference to the accompanying drawings. Embodiments are described in sufficient detail to enable those skilled in the art in the art to easily practice the technical idea of the present disclosure. Detailed disclosures of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Figure 3:
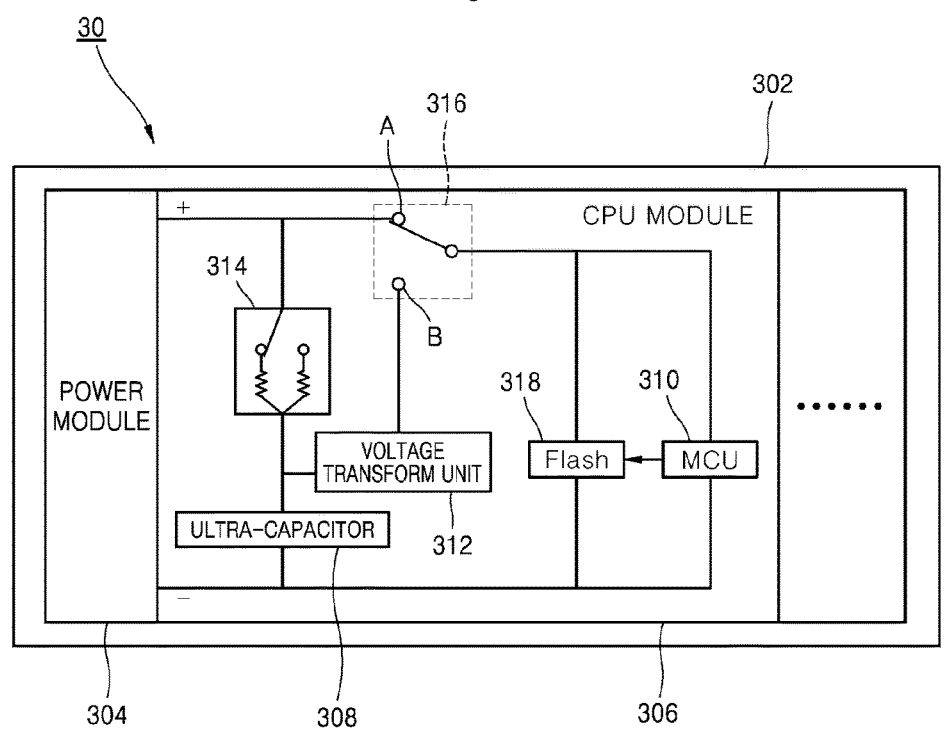
FIG. 3 illustrates a configuration of a CPU module included in a PLC system according to some embodiments of the present disclosure.

FIG. 3 illustrates a configuration of a CPU module included in a PLC system according to some embodiments of the present disclosure.

Referring to FIG. 3, a PLC system 30 according to some embodiments of the present disclosure includes a base 302, and a power module 304 and a CPU module 306, which are mounted on the base 302. For reference, the base 302 may additionally mount thereon another module such as a communications module or an I/O module besides the power module 304 and the CPU module 306.

The power module 304 generates power and supplies the generated power to the CPU module 306. The power module 304 may include a different capacity depending on its type.

The CPU module 306 is supplied with the power from the power module 304 for the operation. The CPU module 306 includes a MCU 310 and a memory unit 318. The MCU 310 performs various calculation functions required for the operation of the PLC system 30 and control functions for another module, and also performs any functions of managing the user data.

The memory unit 318 serves to store therein various data needed for the operations of the PLC system 30. In particular, when the supply of power from the power module 304 is interrupted due to the abnormality occurrence in the power module 304, the user data may be backed up to the memory unit 318 under a control of the MCU 310.

While the memory unit 318 is shown in FIG. 3 to be a flash memory by way of an example, the type of the memory unit 318 is not necessarily limited thereto. Some embodiments of the present disclosure can quickly perform the backup function as compared to the low-speed memory such as the conventional SRAM by using the high-speed memory such as the flash memory. However, in case of using the high-speed memory as in some embodiments of the present disclosure, the power consumption increases as compared to the case of using the low-speed memory. Hence, as described below, some embodiments of the present disclosure employs a capacitor, e.g., a ultra-capacitor 308, which can provide much power as compared to the conventional secondary battery.

Turning to FIG. 3, the CPU module 306 includes the ultra-capacitor 308. The ultra-capacitor 308 is coupled to the power module 304 and accumulates thereon the power supplied from the power module 304 by means of the charging operation. When the supply of power from the power module 304 is interrupted due to the abnormality occurrence in the power module 304, the ultra-capacitor 308 can supply the accumulated power to the MCU 310 and the memory unit 318.

Meanwhile, a variable resistor unit 314 may be coupled between the ultra-capacitor 308 and the power module 304. When the ultra-capacitor 308 is charged, large current is instantaneously supplied from the power module 304 to the ultra-capacitor 308. Therefore, the amount of the current flowed into the ultra-capacitor 308 may be adjusted through the variable resistor unit 314 coupled between the ultra-capacitor 308 and the power module 304.

Since the power module 304 includes a different capacity depending its type as mentioned above, the resistance of the variable resistor unit 314 may be flexibly determined depending on the capacity of the power module 304. Accordingly, if the capacity of the power module 304 is large, then it is possible to allow much more current to be flowed from the power module 304 into the ultra-capacitor 308 by changing the resistance of the variable resistor unit 314 to be smaller. Further, if the capacity of the power module 304 is less, then it is possible to allow relatively less current to be flowed from the power module 304 into the ultra-capacitor 308 by changing the resistance of the variable resistor unit 314 to be larger. Thus, the charging of the ultra-capacitor 308 may be most quickly performed according to the change in the resistance of the variable resistor unit 314 and it is possible to prevent over-current exceeding the capacity of the power module from being flowed thereto.

For example, as shown in FIG. 3, the variable resistor unit 314 may include two resistors and the resistance of the variable resistor unit 314 may be changed by alternatively coupling to either of the two resistors depending on the capacity of the power module 304. While only two resistors are shown in FIG. 3 to be included in the variable resistor unit 314, the number of resistors therein may vary according to embodiments.

Turning to FIG. 3, the CPU module 306 includes a switching unit 316. The switching unit 316 alternatively couples either the the power module 304 or the ultra-capacitor 308 to the MCU 310 and/or the memory unit 318 depending on the state of power being supplied from the power module 304. For example, when the power module 304 operates normally, the switching unit 316 couples the MCU 310 and the memory unit 318 to a terminal A, thereby enabling the supply module 304 to supply the power to the MCU 310 and the memory unit 318. On the contrary, when the abnormality occurs in the power module 304, the switching unit 316 couples the MCU 310 and the memory unit 318 to a terminal B, thereby enabling the ultra-capacitor 308 to supply the power to the MCU 310 and the memory unit 318.

Turning to FIG. 3, the CPU module 306 may further include a voltage transform unit 312. The voltage transform unit 312 is coupled between the ultra-capacitor 308 and the switching unit 316. The voltage transform unit 312 serves to transform a voltage supplied from the ultra-capacitor 308 to correspond to that needed for the MCU 310 or the memory unit 318. For example, if the voltage needed for the operation of the memory unit 318 is 5 V and the voltage outputted from the ultra-capacitor 308 is 3 V, then the voltage transform unit 312 boosts up the voltage outputted from the ultra-capacitor 308 to be 5 V and then supplies the boosted voltage to the memory unit 318.

Hereinafter, the procedure of operation processes of the PLC system 30 according to some embodiments of the present disclosure will be described with reference to FIG. 3.

In some embodiments of the present disclosure, a charging process of the ultra-capacitor 308 is first performed for supplying the power upon the power outage. The MCU 310 receives information on a current charging ratio of the ultra-capacitor 308 from the ultra-capacitor 308. If the charging ratio of the ultra-capacitor 308 is below a preset reference charging ratio, then the MCU 310 preferentially performs a charging of the ultra-capacitor 308 while restricting operations of another module included in the PLC system 30. At this time, the basic functions, e.g., a lightening or initialization operation of LED, essentially needed for the PLC system 30 may be exceptionally performed as necessary along with the charging operation of the ultra-capacitor 308 without significantly consuming the power.

To charge the ultra-capacitor 308, the MCU 310 sends a switching signal to the switching unit 316 for the release of connection. The switching unit 316 having received the switching signal does neither couple to the terminal A nor the terminal B. Accordingly, the power module 304 provides the power just to the ultra-capacitor 308.

As such, according to some embodiments of the present disclosure, the normal operations of another module are restricted until the charging of the ultra-capacitor 308 is completed. Therefore, the supply of power, e.g., the charging, from the power module 304 to the ultra-capacitor 308 has to be completed quickly as soon as possible. According to some embodiments of the present disclosure, in order to quickly charge the ultra-capacitor 308 as soon as possible, the variable resistor unit 314 may be coupled between the power module 304 and the ultra-capacitor 308, as in FIG. 3.

In some embodiments of the present disclosure, the power module 304 may provide information on its power supply capacity to the MCU 310. The MCU 310 may decide the resistance of the variable resistor unit 314 depending on the capacity of the power supply of the power module 304. If the capacity of the power module 304 is large, then the MCU 310 may allow much more current to be flowed from the power module 304 into the ultra-capacitor 308 by changing the resistance of the variable resistor unit 314 to be smaller. Further, if the capacity of the power module 304 is less, then the MCU 310 may allow relatively less current to be flowed from the power module 304 into the ultra-capacitor 308 by changing the resistance of the variable resistor unit 314 to be larger. Thus, the charging of the ultra-capacitor 308 may be most quickly performed according to the change in the resistance of the variable resistor unit 314 and it is possible to prevent over-current exceeding the capacity of the power module from being flowed thereto.

When the charging of the ultra-capacitor 308 is completed, the ultra-capacitor 308 sends a charging completion signal to the MCU 310. The MCU 310 having received the charging completion signal sends a switching signal to the switching unit 316 for the initiation of connection. Accordingly, the switching unit 316 changes a connection terminal to the terminal A to suspend the supply of power for the charging of the ultra-capacitor 308, and the power module 304 supplies the power to the CPU module 306.

When, afterwards, the supply of power becomes impossible due to the abnormality occurrence in the power module 304, the power module 304 sends an alarm signal to the MCU 310 that the abnormality has occurred during the supply of power. The MCU 310 having received the alarm signal sends a switching signal to the switching unit 316 for the switching between the connection terminals. The switching unit 316 having received the switch signal changes the connection terminal from the connection terminal A to the connection terminal B. Accordingly, the MCU 310 and the memory unit 318 can be supplied with the power from the ultra-capacitor 308. At this time, there may be a difference between the voltage needed for the MCU 310 and the memory unit 318 and the voltage supplied from the ultra-capacitor 308. Accordingly, the voltage transform unit 312 may transform the voltage supplied from the ultra-capacitor 308 to correspond to that needed for the MCU 310 and the memory unit 318.

The MCU 310 having received the alarm signal from the power module 304 performs an operation of backing up the user data stored in the MCU 310 into the memory unit 318. Such a backup operation may be performed using the power supplied by the ultra-capacitor 308.

Meanwhile, during performing the backup operation, the power module 304 may be recovered to resume the supply of power. In this case, the MCU 310 sends a switching signal to the switching unit 316 only after the backup of the user data is finished and then couples the power module 304 to the MCU 310 and the memory unit 318. In other words, according to some embodiments of the present disclosure, although the power module 304 is normally recovered in the middle of performing the backup in a state where the ultra-capacitor 308 serves as the power supply source due to the power outage, the ultra-capacitor 308 continues to serve as a power supply source as it is, without changing the power supply source to the power module 304 for the sake of safety of backup operation, until the backup is finished. This operation can prevent the possibility of data loss which may be caused by replacing the power supply.

The PLC system according to some embodiments of the present disclosure includes a CPU module driven by the power supplied from the power module, wherein the CPU module includes a MCU configured to perform calculation and control functions, a memory unit configured to store therein various data relevant to the operations, and a capacitor coupled to the power module. The capacitor is charged by the power module, and supplies the power to the memory unit when the power supply from the power module is interrupted. Hereby, even though the supply of power from the power module is suddenly interrupted, the memory unit can be driven by the power supplied from the capacitor, thereby prevent the data from being lost.

The present disclosure described above may be variously substituted, altered, and modified by those skilled in the art to which the present disclosure pertains without departing from the scope and sprit of the present disclosure. Therefore, the present disclosure is not limited to the above-mentioned embodiments and the accompanying drawings. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A Programmable Logic Controller (PLC) system configured to receive power from a power module, the PLC system comprising:
   a memory unit configured to back up user data stored in a Micro Controller Unit (MCU) when a power supply from a power module is interrupted;
   a capacitor configured to be charged by the power module and supply accumulated power to the memory unit when the power supply from the power module to the MCU is interrupted;
   a variable resistor unit configured to be connected between the power module and the capacitor; and
   a switching unit configured to alternatively connect either the power module or the capacitor to the memory unit depending on a state of power supplied from the power module,
   wherein another operation of the PLC system, other than the charging of the capacitor, is restricted until the charging of the capacitor is completed.

2. The PLC system according to claim 1, wherein a resistance of the variable resistor unit is determined based at least on a capacity of the power module.

3. The PLC system according to claim 1, further comprising:
   a voltage transform unit configured to be coupled between the capacitor and the switching unit and transform a voltage supplied from the capacitor to a voltage needed for the memory unit.

4. The PLC system according to claim 1, wherein the switching unit is further configured to couple the power module and the memory unit only when the user data back-up is completed and wherein when the supply of power from the power module is resumed during user data back-up, the switching unit is further configured to continue coupling the capacitor to the memory unit.

* * * * *